(12) United States Patent  
Roohparvar

(10) Patent No.: US 7,047,455 B2  
(45) Date of Patent: May 16, 2006

(54) MEMORY WITH ELEMENT REDUNDANCY

(75) Inventor: Frankie F. Roohparvar, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/932,968

(22) Filed: Sep. 2, 2004

(65) Prior Publication Data

US 2005/0028054 A1 Feb. 3, 2005

Related U.S. Application Data

(62) Division of application No. 09/838,764, filed on Apr. 19, 2001.

(51) Int. Cl.
*G11C 29/00* (2006.01)

(52) U.S. Cl. ...................................... 714/710; 714/718

(58) Field of Classification Search ................ 714/710, 714/718, 723
See application file for complete search history.

(56) References Cited

U.S. PATENT DOCUMENTS

| | | | |
|---|---|---|---|
| 4,899,342 A | 2/1990 | Potter et al. | |
| 5,077,736 A | 12/1991 | Dunphy, Jr. et al. | |
| 5,329,488 A | 7/1994 | Hashimoto | |
| 5,359,569 A | 10/1994 | Fujita et al. | |
| 5,392,292 A | 2/1995 | Davis et al. | |
| 5,559,742 A | 9/1996 | Lee et al. | |
| 5,602,987 A | 2/1997 | Harari et al. | |
| 5,748,527 A | 5/1998 | Lee et al. | |
| 5,796,653 A | 8/1998 | Gaultier | |
| 5,917,838 A | 6/1999 | Wardrop | |
| 5,995,413 A | 11/1999 | Holzmann et al. | |
| 6,034,891 A | 3/2000 | Norman | |
| 6,078,534 A | 6/2000 | Pfefferl et al. | |
| 6,149,316 A | 11/2000 | Harari et al. | |
| 6,351,412 B1 | 2/2002 | Nozoe et al. | |
| 6,359,806 B1 | 3/2002 | Nozoe et al. | |
| 6,469,932 B1* | 10/2002 | Roohparvar et al. | ... 365/185.09 |
| 6,505,306 B1 | 1/2003 | Blackmon et al. | |
| 6,671,214 B1* | 12/2003 | Abedifard et al. | .......... 365/200 |
| 6,847,565 B1* | 1/2005 | Abedifard et al. | .......... 365/200 |

* cited by examiner

*Primary Examiner*—Albert Decady
*Assistant Examiner*—Cynthia Britt
(74) *Attorney, Agent, or Firm*—Leffert Jay & Polglaze, P.A.

(57) ABSTRACT

A memory device to perform an erase operation algorithm that specifically deals with different types of defects in a memory array. The memory array of one embodiment of the present invention has primary and redundant elements. A register is used for each redundant element to store the address of a defective primary element and an error code that indicates the type of defect in the defective primary element. Control circuitry is used to control memory operations to the memory array. The control circuitry performs an erase operation algorithm that is specific to an error code when a defective primary element is addressed during an erase operation.

20 Claims, 5 Drawing Sheets

MEMORY WITH ELEMENT REDUNDANCY

RELATED APPLICATION

This Application is a Divisional of U.S. application Ser. No. 09/838,764 filed Apr. 19, 2001, and which is commonly assigned.

TECHNICAL FIELD OF THE INVENTION

The present invention relates generally to memory devices and in particular the present invention relates to a memory with redundancy elements and their operation.

BACKGROUND OF THE INVENTION

Memory devices are typically provided as internal storage areas in a computer. One type of memory used to store data in a computer is random access memory (RAM). RAM is typically used as main memory in a computer environment. Most RAM is volatile. That is, RAM generally requires a steady flow of electricity to maintain its contents. As soon as the power is turned off, all data stored in the RAM is lost.

Another type of memory is a non-volatile memory. A non-volatile memory is a type of memory that retains stored data when power is turned off. A flash memory is a type of non-volatile memory. An important feature of a flash memory is that it can be erased and reprogrammed in blocks instead of one byte at a time. Each block of memory in a memory array of the flash memory comprises rows and columns of memory cells. Many modern computers have their basic I/O system (BIOS) stored on flash memory chips.

As with other memory devices, defects can occur during the manufacture of a flash memory array having rows and columns of memory cells. Typical defects can include bad memory cells, open circuits, shorts between a pair of rows and shorts between a row and column. Shorts typically occur because of the large number of rows and columns of memory cells that have to be placed in close proximity to each other on an integrated circuit wafer. Defects can reduce the yield of the flash memory device. A way to resolve this problem, without discarding the memory device, is to incorporate redundant elements in the memory that selectively replace the defective elements. For example, redundant columns are a common form of redundant elements used in flash memory to replace defective memory cells coupled to a primary column. Redundant rows are another common form of redundant elements used in flash memory to replace defective memory cells coupled to a primary row.

After a memory die has been manufactured, it is tested for defects. Generally with volatile memory, redundant circuitry or redundant fuse circuitry is used to selectively route address requests directed to the defected elements to the redundant elements. Redundant circuitry can comprise registers of banks of multiple electrical fuses that are selectively "blown" (i.e. open circuited) to store the address of the defective elements in the primary array. Thereafter, the redundant circuitry compares each address request with addresses stored in the banks of electrical fuses. When the redundant circuitry discovers an address request that matches an address in a bank of electric fuses, the address request is redirected to an associated redundant element instead of the defective element in the primary array. The electrical fuses are generally blown by one of two methods to store the address of the defective elements. The first is known as the Ohm heating method. This method involves driving a substantial current through a fuse to melt the fuse's conductive material. The other method is known as the laser method. The laser method uses a laser to cut a fuse's conductive material. Anti-fuse circuitry having anti-fuse registers can also be used to store the address of defective elements in the primary array. Anti-fuses are normally open and short circuited (closed) when programmed.

Some memory devices, including some flash memory devices, utilize registers of non-volatile memory to store addresses of defective elements in the primary array. As with registers of banks of multiple fuses, the non-volatile registers are generally contained in redundant circuitry or a redundant circuit. The redundant circuit compares address requests to addresses stored in the registers. If an address request matches an address stored in a register, the redundant circuit directs or maps the address request to an associated redundant element instead of the defective element.

Generally, the use of redundant elements works well, however, problems can occur if the defect involves shorts between two rows or shorts between a row and a column in a primary memory block array. This is because, even though a redundant row or column is read to or written to instead of the defective row or column, the short is still embedded in the primary memory array and the defect can effect other elements in the primary array. For example, a row that is shorted to another row may result in problems during the pre-program and soft program cycles of an erase operation. A method is needed to determine the type of defect the redundant elements are designated to replace and to selectively deal with the specific type of defect during an erase operation.

For the reasons stated above, and for other reasons stated below which will become apparent to those skilled in the art upon reading and understanding the present specification, there is a need in the art for a flash memory that has the ability to implement and manage a redundant circuit in a flash memory to deal with specific defects during an erase operation.

SUMMARY OF THE INVENTION

The above-mentioned problems with memory devices and other problems are addressed by the present invention and will be understood by reading and studying the following specification.

In one embodiment, the present invention provides a flash memory device having a memory array with primary and redundant cells and redundant fuse circuitry. The redundant fuse circuitry is used to replace primary memory cells with the redundant memory cells. In addition, the redundant fuse circuitry stores an error code indicating a type of defect.

In another embodiment, a flash memory device comprises at least one register and a state machine. The at least one register is used to store an address of a defective element in a primary memory array. The register further has at least one data bit to store an error code. The state machine is used to execute an algorithm based on the error code stored in the register.

In another embodiment, a flash memory device comprises a memory array, redundant array elements, a register for each redundant array element, a redundant circuit and control circuitry. Each register is used to store an address of a defective element in the memory array. Each register is further used to store an error code. The redundant circuit redirects address requests from the defective element to an associated redundant array element. The control circuitry is used to execute an algorithm based on the error code stored in the register.

In another embodiment, a flash memory device comprises, a memory array having memory cells arranged in columns and rows, at least one redundant row and a register for each redundant row. Each redundant row is coupled to the memory array to replace an associated defective row in the memory array. Each register stores the address of an associated defective row. Moreover, each register further stores an error code that indicates the type of error the redundant row is used to correct.

In another embodiment, a flash memory device comprises a memory array, at least one redundant column and a register for each redundant column. The memory array has memory cells arranged in columns and rows. The at least one redundant column is mapped to the memory array to replace an associated defective column in the memory array. Each register is used to store the address of the associated defective column. In addition, each register has at least one extra bit to store an error code. The error code indicates the type of error in the at least one defective column.

In another embodiment, a flash memory device comprises a memory array having memory cells arranged in columns and rows, at least one redundant row, a register for each redundant row, a redundant circuit and control circuitry. The at least one redundant row is used to replace an associated defective row in the memory array. Each register is used to store the address of an associated defective row. Each register further has at least one bit to store an error code that indicates the type of defect in the associated defective row. The a redundant circuit compares address requests to the addresses in the registers and directs address requests matching addresses in the registers to the associated redundant row instead of the defective row in the memory array. The control circuitry is used to execute an erase operation algorithm based on the error code stored in each register.

In another embodiment, a flash memory device comprises a memory array having memory cells arranged in columns and rows, at least one redundant row, at least one redundant column and a register for each redundant row and each redundant column. Each redundant row is used to replace an associated defective row in the memory array. Each redundant column is used to replace an associated defective column in the memory array. Each register is used to store the addresses of associated defective rows and columns. Moreover, each register has at least one bit to store an error code. The error code indicates the type of defect the redundant row or column is used to correct.

In another embodiment, a flash memory system comprises a processor to provide data, a memory array to store data from the processor, at least one redundant element, a register for each redundant element, a redundant circuit and control circuitry. The at least one redundant element is used to replace an associated defective element in the memory array. Each register stores the address of an associated defective element. Moreover, each register has at least one extra bit to store an error code. The error code indicates the type of defect in an associated defective element. The redundant circuit compares address requests to the addresses in the registers and directs address requests matching addresses in the registers to the associated redundant element instead of the defective element in the memory array. The control circuitry is used to execute an erase operation algorithm based on the error code stored in a register.

In another embodiment, a flash memory system comprises a processor to provide data, a memory array to store data from the processor, at least one redundant row, at least one redundant column, a register for each redundant row and each redundant column, a redundant circuit and a state machine. The memory array has memory cells arranged in columns and rows. The at least one redundant row is used to replace an associated defective row in the memory array. The at least one redundant column is used to replace an associated defective column in the memory array. Each a register is used to store the address of each associated defective row and each associated defective column. Each register has at least extra one bit to store an error code that indicates the type of defect in the respective defective row or column. The redundant circuit is used to compare address requests to the addresses in the registers and direct address requests matching addresses in the registers to the associated redundant row or column instead of the defective row or column in the memory array. The state machine is used to execute an erase operation algorithm based on the error code stored in each register.

A method of operating a flash memory comprising, initiating an erase operation on a memory array having redundant elements, matching a requested address with an address of a defective element stored in a register associated with a redundant element, reading an error code stored in the register and executing an erase operation algorithm based on the error code.

A method of performing a pre-program cycle of an erase operation on a flash memory having a row to row short in the primary array and a pair of redundant rows to replace the rows shorted together comprising, reading an error code that indicates a row to row short, pre-programming the redundant rows, setting the row address to the first address of the primary array, pre-programming each row in the primary array incrementally until a row address matches a redundant row address, disabling a redundant circuit that redirects address requests from the shorted rows to the redundant rows, pre-programming the current row and the following row simultaneously, incrementing the row address to skip over the following shorted row and pre-programming the remaining rows in the primary array.

A method of performing a soft program cycle of an erase operation on a flash memory having a row to row short in the primary array and a pair of redundant rows to replace the rows shorted together comprising, reading an error code that indicates a row to row short, setting column address to beginning of primary array, monitoring each column incrementally for a current level above a threshold level that would indicate an over-erased cell is coupled to the column, when a current level above the threshold level is detected in a column, applying a soft program pulse to the redundant rows coupled to the column, verifying if the current level in the column is still above the threshold level, when current level is still above the threshold level, applying a soft program pulse to the rows in the primary array incrementally until the current level in the column is below the threshold level or until a row address matches an address in a register associated with a redundant row, when a row address matches an address in the register, disabling a redundant circuit that redirects address requests from the shorted rows to the redundant rows, activating the shorted rows together, applying a soft program pulse simultaneously to the shorted rows, incrementing the row address beyond the shorted rows once the soft program pulse has been applied to the shorted rows, verifying if current level in the column is still above the threshold level and when current is still above the threshold level, applying a soft program pulse incrementally to the remaining rows coupled to the column until the current can no longer be detected.

Another method of operating a flash memory comprising, storing an address of a redundant element in a register, storing an error code in the register that corresponds to the type of error the redundant element is used to correct, reading the error code and performing an erase operation based on the error code.

A method of manufacturing a flash memory comprising, testing the memory array for defective elements, adding redundant elements to selectively replace the defective elements, mapping redundant elements to the memory array, storing addresses of redundant elements in a register and storing an error code in each register that indicates the type of defect the redundant element is being used to correct.

Another method of manufacturing a flash memory comprising, identifying a defective primary element and programming a redundant fuse circuit, wherein the redundant fuse circuit stores a defective code.

DETAILED DESCRIPTION OF THE INVENTION

In the following detailed description of present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Embodiments of the present invention use registers to store addresses of defective rows and columns in a primary array. Each register can also store an error code that describes the nature of the defect in the defective row or column. An algorithm can then use the error code to adjust an erase operation for the type of defect indicated. This avoids problems associated with erase operations of memory arrays with row to row or row to column shorts. It will be appreciated by those in the art that the registers could comprise non-volatile memory cells, a fuse block, an anti-fuse block or any other device capable of storing an address and error code and that the registers of the present invention are not limited to a fuse, anti-fuse or non-volatile memory cells.

Figure 2:
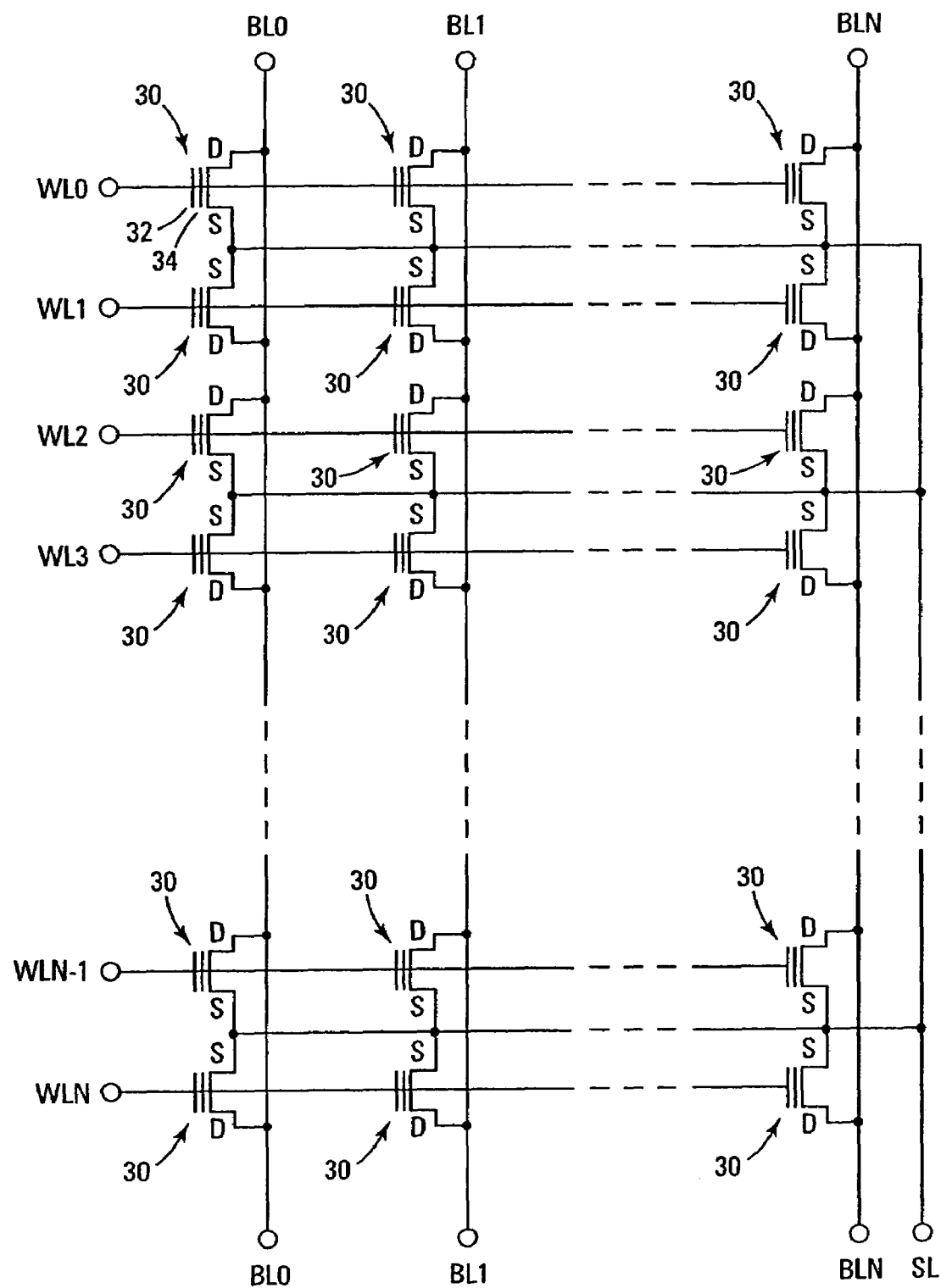
FIG. 2 is an illustration of a block of memory containing rows of word lines and columns of bit lines in the prior art.

To better understand the invention, a short description of a typical flash memory array and a typical erase operation are provided with reference to FIG. 2. A flash memory array is made up of blocks of rows and columns of memory cells (cells) 30. As illustrated, drains D of cells 30 located in a column are coupled to a common bit line BL. Wherein bit lines BL comprise bit lines BL0 through BLN. Control gates 32 of cells 30 located in a row are coupled to a common word line WL. Wherein the word lines WL comprise word lines WL0 through WLN. Moreover, a source line SL is coupled to each source S of each memory cell in each block of cells 30. A block of cells is erased by putting a negative voltage on each word line WL in the block and taking the source SL of the block up to Vcc or higher. This action creates an electronic field that forces electrons from a floating gate 34 of each cell 30 to the source S of the cell 30.

A common problem encountered in erasing a cell 30 in flash memory is over erasure. A cell becomes over-erased if too many electrons are removed from its floating gate 43. An over-erased cell 30 is a problem because it can leak current in its drain D and into the bit line BL the drain D is coupled to, even when an associated word line WL is not activated. This is a potential problem because an over-erased cell 30 coupled to a bit line BL of cells 30 can falsely convey, during a read operation, that all the cells 30 coupled to the bit line BL are erased even though they may be programmed.

An erase operation 20 is an algorithm designed to prevent over-erased cells. An erase operation 20 typically comprises a pre-program cycle 22, followed by an erase cycle 24, which is then followed by a soft program cycle 26. The pre-program cycle 22 puts each memory cell in a programmed state. This is accomplished by applying a program pulse to each memory cell to store a charge on the cell's 30 floating gate 34. The purpose of pre-program cycle 22 is to ensure each cell 30 in the memory array has charge on its floating gate 34 before the erase cycle 24 is performed on the block. This eliminates or at least reduces the chance of removing too many electrons from the floating gates 34 of the memory cells during the erase cycle 24.

Once the pre-program cycle 22 has been completed, the erase cycle 24 is performed. The erase cycle begins by erasing the block of cells 30. An erase verify is then performed. An erase verify reads each cell 30 of the block to determine if it is in an erased state. If a cell is discovered that is not in an erased state during erase verify, the whole block of cells 30 is further erased. The process is repeated until all the cells 30 in the block are in an erased state.

The soft program cycle 26 or heal cycle corrects any over-erased memory cells after the erase cycle has been completed. The soft program cycle starts by monitoring each bit line BL for a current level that would indicate an over-erased cell is coupled to the bit line BL. A current level that would indicate an over-erased cell is a current level that is above a predetermined threshold level when all the word lines WL coupled to the bit line BL are un-activated. If a current level is found in a bit line that would indicate an over-erased cell, a soft program pulse or program pulse is applied to the word lines WL coupled to the Bit Line incrementally until the current can no longer be detected. The soft program cycle 26 is complete when a current level indicating an over-erased call cannot be detected in any of the bit lines BL. The soft program cycle 26 can also be called a Vt (threshold voltage) distribution tightening cycle. Moreover, the program pulse can be called a Vt tightening pulse.

Figure 1:
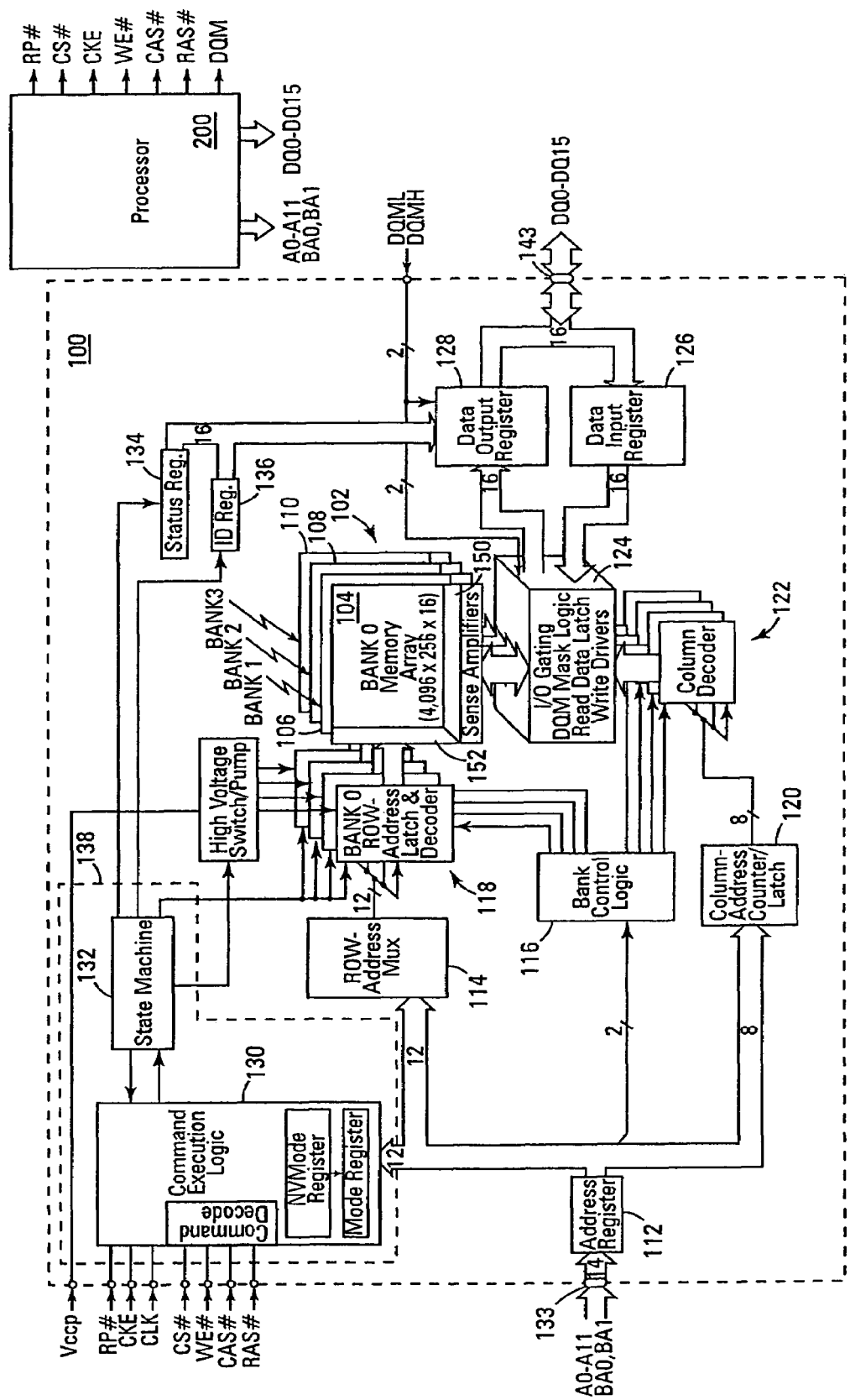
FIG. 1 is a block diagram of one embodiment of the present invention.

One embodiment of the present invention is illustrated in FIG. 1. As illustrated, first and second redundant circuits 150, 152 are coupled to an array of non-volatile memory cells 102 in a synchronous flash memory device 100. A synchronous flash memory combines the non-volatile storage capacities of flash memory with a SDRAM compatible interface. Although this embodiment deals with a synchronous flash memory, it will be appreciated by those in the art, that the present invention can be applied to other flash memory systems and that the present invention is not limited to synchronous flash memory systems.

The memory device 100 of this embodiment includes an array of non-volatile flash memory cells 102. The array is arranged in a plurality of addressable banks. In one embodiment, the memory contains four memory banks 104, 106, 108 and 110. Each memory bank contains addressable sectors of memory cells. Command execution logic 130 is provided to control the basic operations of the memory device. A state machine 132 is also provided to control specific operations performed on the memory array and cells. The command execution logic 130 and/or state machine 132 can be generally referred to as control circuitry 138 to control read, write and other memory operations. More importantly for the present invention, the state machine 132 or control circuitry 138 controls the erase operation algorithm of the array of non-volatile flash memory cells 102. A status register 134 and an identification register 136 can also be provided to output data. The data connections (DQ) 143 are typically used for bi-directional data communication. The memory can be coupled to an external processor 200 for operation or testing.

The data stored in the memory can be accessed using externally provided location addresses received by address register 112 via address signal connections 133. The row addresses are decoded using row address multiplexer circuitry 114. The addresses are also decoded using bank control logic 116 and row address latch and decode circuitry 118. In addition, to access an appropriate column of the memory, column address counter and latch circuitry 120 couples the received addresses to column decode circuitry 122. Circuit 124 provides input/output gating, data mask logic, read data latch circuitry and write driver circuitry. Data is input through data input registers 126 and output through data output registers 128 via data connections.

The synchronous flash memory array architecture is designed to allow blocks of memory cells to be erased without disturbing the rest of the array. The array is divided into 16 addressable blocks that are independently erasable. By erasing blocks rather than the entire array, the total device endurance is enhanced, as is system flexibility. The array is equally divided into four banks 104, 106, 108 and 110 of four blocks each (16 blocks). The four banks have simultaneous read-while-write functionality. That is, a WRITE or ERASE operation to any bank can occur simultaneously to a READ operation to any other bank.

Figure 3:
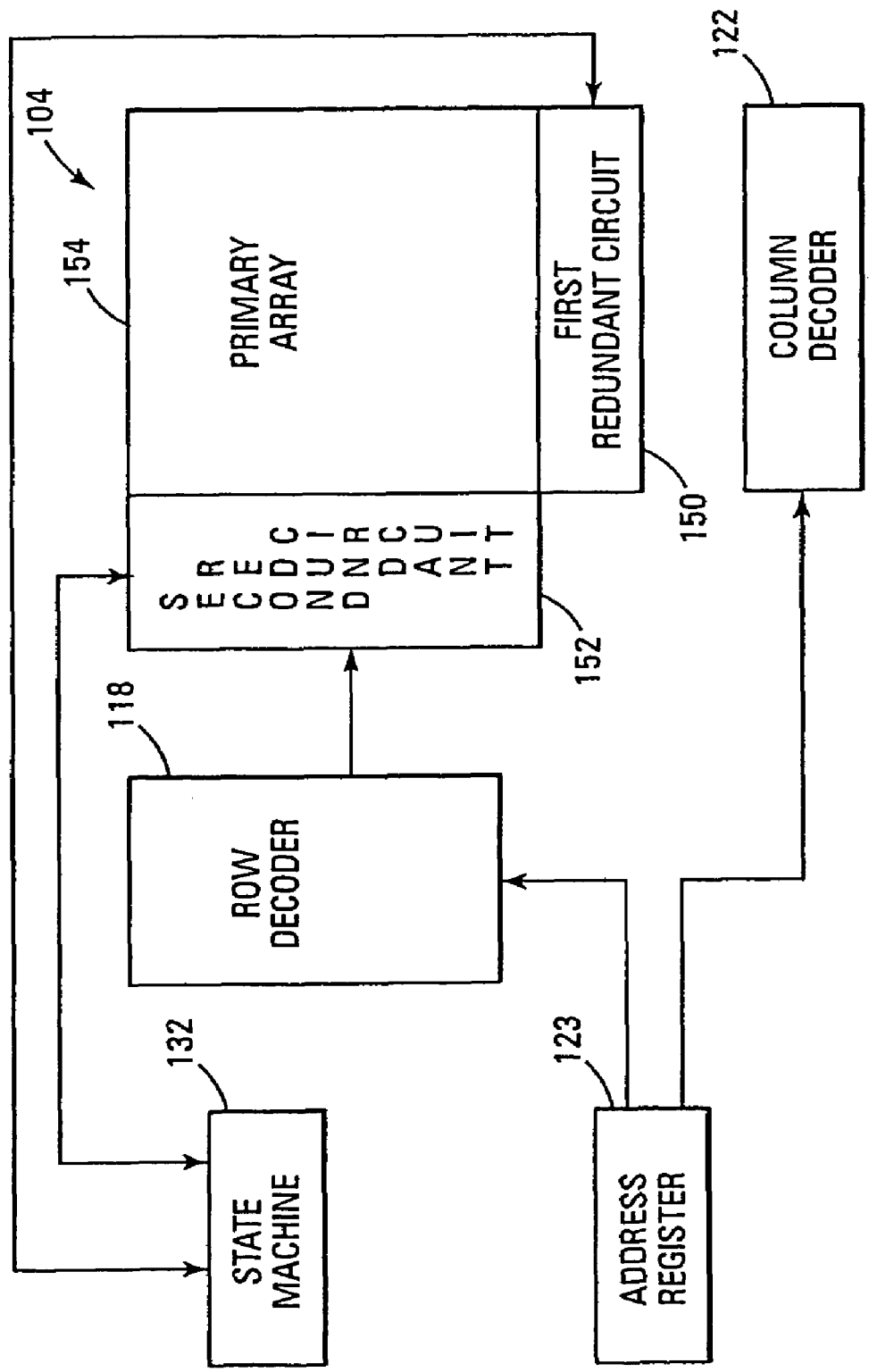
FIG. 3 is a block diagram of one embodiment of the present invention.

A simplified illustration of one embodiment of the first redundant circuit 150 and the second redundant circuit 152 is illustrated in FIG. 3. As illustrated, the first redundant circuit 150 and the second redundant circuit 152 are coupled to a primary array 154. When an address request comes from the address register 123, the respective first or second redundant circuit 150, 152 compares the requested address to the addresses stored in the registers, if a match is found the respective redundant row or column is pointed to instead of a defected row or column in the primary array 154. Although, FIG. 3 illustrates a first and second redundant circuit 150, 152, it will be realized by those in the art that the first and second redundant circuit 150, 152 could be combined into one circuit and that the present invention is not limited to a first and second redundant circuit 150, 152. Moreover, the reference to a redundant circuit 156 used in this description shall mean a first and second redundant circuit 150, 152.

Figure 4:
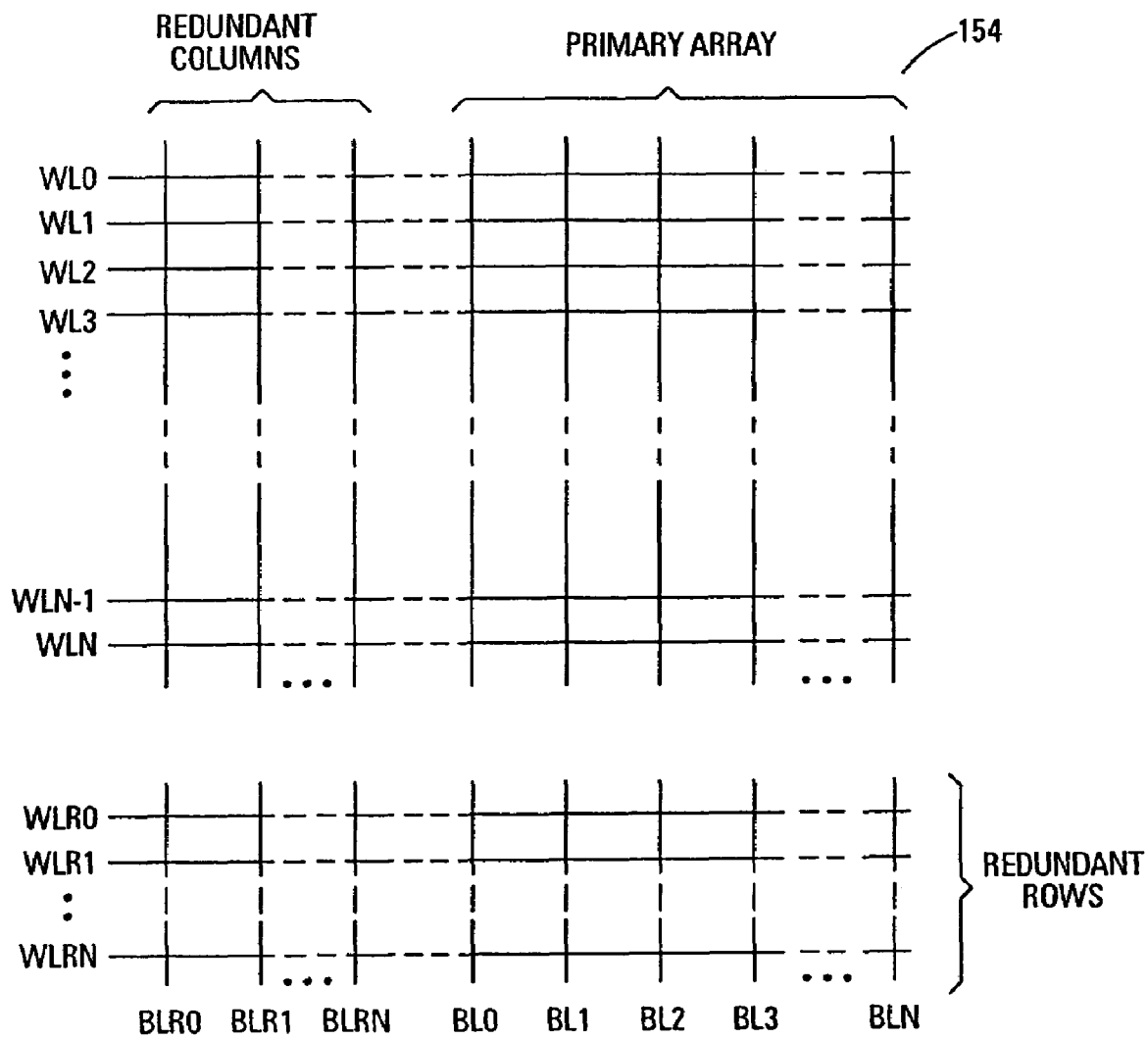
FIG. 4 is an illustration of a block of memory including redundant rows and columns of the present invention.

A simplified illustration of how the redundant row and columns are mapped or coupled to the primary array is illustrated in FIG. 4. FIG. 4 is illustrated with a primary array 154 of rows or word lines WL0 through WLN and columns or bit lines BL0 through BLN. The rows and columns in the primary array 154 are coupled to redundant rows BLR0 through BLN and redundant columns WLR0 through WLRN.

If a row or column in the primary array 154 is found to be defective, the first or second redundant circuit 150, 152 redirects the address request from the defective row or column to an associated redundant row or column. For example, if row WL0 is found to be defective the second redundant circuit 152 redirects an address request directed to word line WL0 to redundant word line WLR0. Likewise, if column BL0 is found to be defective the first redundant circuit 150 redirects an address request directed to column BL0 to redundant column BLR0.

Figure 5:
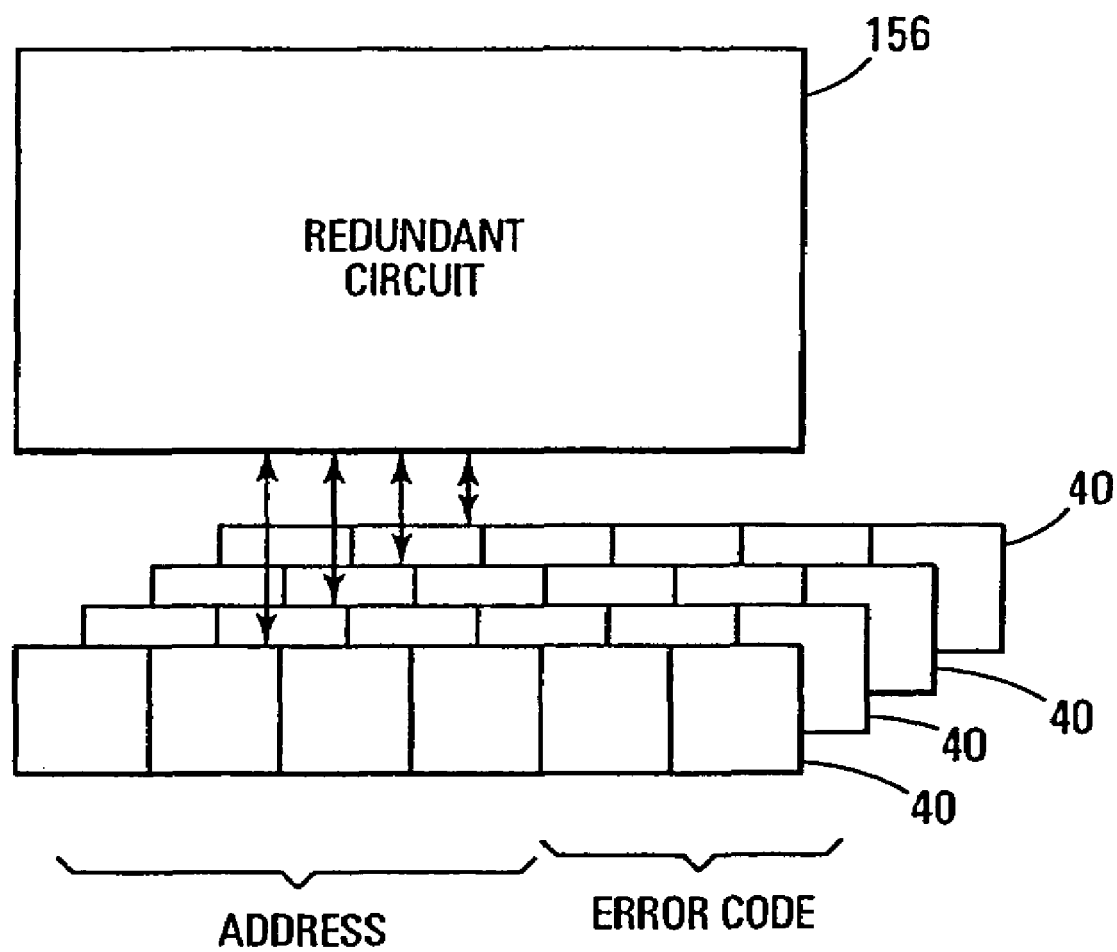
FIG. 5 is an illustration of a redundant circuit and register of the present invention.

A redundant circuit 156 and a register 40 of one embodiment of the present invention is illustrated in FIG. 5. The register 40 stores an address of an associated defective element in the primary array 154. The register 40 also has at least one extra memory cell or bit to store an error code. The error code designates the type of defect in the defective element. That is, the error code describes the defect in the element in the primary array that is corrected by the redundant element. FIG. 5 illustrates four registers 40 each having 2-bits of error code. However, it will be recognized by those in the art, that the number of registers 40 used will depend on the number of redundant elements used to repair defective elements in a primary memory array and the present invention is not limited to four registers. Moreover, it will also be recognized by those in the art, that the number of bits used to store the error code in each register will depend on the number of different types of errors tracked in the defective elements and the present invention is not limited to registers with two bits to store error codes.

In one embodiment of the present invention, when a redundant circuit 156 determines an address request matches an address in a register 40, the redundant circuit 156 relays the error code from the register 40 to the state machine 132 or control circuitry 138. During an erase operation, the state machine 132 then executes an erase operation algorithm that is specific to each error code. For example, an error code could indicate an isolated defected, a row to column short or a row-to-row short. The state machine 132 would then implement an erase operation algorithm to specifically deal with an isolated defect, a row to column short or a row-to-row short.

In one embodiment, a typical erase operation is implemented on a block of memory cells 30 until an address is discovered that matches an address in a register 40. The error code in the register 40 is then read and the appropriate erase operation is applied. If the error code indicates an isolated defect, a typical erase operation is continued. If the error code indicates a row to column short, a row to column erase operation is performed. In addition, if the error code indicates a row-to-row short, a row-to-row erase operation will be performed.

If the error code indicates a defect that is isolated to a specific row or column, the algorithm of the present invention directs the address decoder to point to the redundant row or column instead of the defective row or column during the pre-program cycle. The redundant row or column is then pre-programmed. Once the redundant row or column is pre-programmed, the address in the next row or column of the primary array is selected and pre-programmed. The pre-program cycle continues until all addresses of the primary array have been accessed. An erase cycle is then performed. A typical erase cycle is performed in the same manner as previously described.

After the erase cycle is complete, the soft program cycle or over-erase check operation is performed. The over-erase check operation begins by monitoring the current levels in each column for a current that would indicate an over-erased cell is coupled to the bit line BL. If a current level is discovered that indicates an over-erase cell coupled to a column or bit line BL, a soft program pulse is applied to each row or word line WL until the current level indicating an over-erased cell is no longer detected. When an address matches an address in a register 40, a soft program pulse is applied to the redundant elements associated to the register 40 instead of the defective elements. An example of an isolated defect would be a bad memory cell, a broken word line WL or a broken bit line BL.

If the error code indicates a row to column short, the pre-program cycle starts by pre-programming the redundant rows and columns. Once the redundant rows and columns have been pre-programmed, the pre-program cycle is performed on the primary array 154. The pre-program cycle is performed incrementally until an address of a row or column matches the address in a register associated with a redundant row or column. The algorithm then disables the redundant circuit 156 (the respective first or second redundant circuit 150, 152) and pre-programs the memory cells in the row or column in the primary array 154. An erase cycle is then performed. An erase cycle in a row to column erase operation is performed in the same manner as previously described.

After the erase cycle has been completed, the soft programming cycle is performed. If a current level is detected in a bit line BL or column that would indicate an over-erased cell is coupled to the column, a soft program pulse is applied to the word lines WL or rows coupled to the suspect column starting with the redundant rows and then proceeding incrementally through the rows of the primary array. After a soft program pulse is applied to a row, the bit line is checked for current. If the current level indicates an over-erased cell is no longer detected, it is assumed that the depleted cell was recovered and the state machine moves on to the next bit line BL. If the current level still indicates an over-erased cell is coupled to the column, a soft program pulse is applied to the following row. When the soft program cycle gets to a row shorted to a column, the algorithm disables the redundant circuit and applies a soft program pulse to the row in the primary array. If a current level that would indicate an over-erased cell is no longer detected in the bit line after the soft program pulse, the state machine moves on to the next column. If, however, the current level still indicates that an over-erased cell is coupled to the column, the state machine applies a soft program pulse to the next row and so forth until the current level indicates an over-erased cell is no longer detected in the column.

If the soft program cycle addresses a column that has a current level that would indicate it is coupled to an over erased cell and whose address matches an address in a register 40, the algorithm disables the redundant matching circuitry and applies the soft program pulses to the memory cells coupled to the column. When the current level that indicates an over-erased cell is no longer detected in the suspect column, the state machine proceeds through the remaining columns.

The pre-program cycle of a row-to-row erase operation begins with pre-programming the redundant memory elements in the redundant memory rows. Thereafter, the memory cells in each block of the memory array are pre-programmed incrementally by row and column addresses. If the redundant circuit comes upon a row address that matches an address in a register 40 and the error code in the register indicates a row-to-row short, the redundant circuit is disabled. The algorithm in the state machine then instructs the decoder to select the current row (row S) and the next row (row S+1) at the same time. The algorithm assumes that row S is shorted to row S+1. Row S and row S+1 are activated together and then programmed simultaneously. That is, cells coupled to row S and row S+1 are simultaneously programmed as the columns or bit lines BL, coupled to row S and row S+1, are incremented. This avoids a conflict that would occur between the driver of row S and the driver of row S+1 that could lead to the collapse of the voltage supply that is driving the word lines WL. If this were to happen, neither the memory cells in row S or the memory cells in row S+1 would be properly programmed. Although, the voltage level supplied simultaneously to two word lines WL will be less than what would be normally supplied to a single word line WL when programming memory cells in a row, the voltage level should still provide enough charge to the floating gates of each memory cell 30 to avoid over-erased memory cells during an erase cycle. Once row S and row S+1 are programmed the algorithm causes the address counter to jump forward a row, thereby skipping over S+1. This process is continued with the rest of the rows until all the memory cells 30 in the block of memory are programmed. An erase cycle is performed once the pre-program cycle has been completed. An erase cycle in a row to column erase operation is performed in the same manner as previously described.

After the entire block has been erased, the soft programming cycle begins. The algorithm directs the state machine to check each bit line for a current level, with all the word lines off, that would indicate an over-erased cell is coupled to the column. The state machine starts with the first column or bit line BL and proceeds incrementally. If current level is detected above the threshold value in column, a soft program pulse is applied to the rows coupled to the suspect column starting with the redundant rows and then proceeding incrementally through the rows of the primary array 154. After a soft program pulse is applied to a row, the current level in the bit line is once again checked. If the current level indicates an over-erased cell is no longer detected, it is assumed that the depleted cell was recovered and the state machine moves on to the next bit line BL. If the current level still indicates an over-erased cell is coupled to the column, the soft program is applied to the next row.

When the soft program gets to the shorted row S, the algorithm disables the redundant matching circuitry and activates row S and row S+1. A soft program pulse is then applied to the cells at row S and row S+1 simultaneously. If the current level no longer indicates an over-erased cell is coupled to the column after row S and row S+1 are simultaneously applied a soft program pulse, the state machine moves on to the next column. If, however, the current level still indicates an over-erased cell is coupled to the column, the state machine increments the row address to skip over S+1 and applies soft program pulse to the next row. The state machine will then proceed through all the remaining rows in the effected column until a current level that indicates an over-erased memory cell is no longer detected.

CONCLUSION

A memory device to perform an erase operation algorithm that specifically deals with different types of defects in a memory array has been described. The memory array of one embodiment of the present invention has primary and redundant elements. A register is used for each redundant element to store the address of a defective primary element and an error code that indicates the type of defect in the defective primary element. Control circuitry is used to control memory operations to the memory array. The control circuitry performs an erase operation algorithm that is specific to an error code when a defective primary element is addressed during an erase operation.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A flash memory system comprising:
   a processor to provide data;
   a memory array to store data from the processor;
   at least one redundant element to replace an associated defective element in the memory array;
   a register for each redundant element to store the address of an associated defective element, each register having at least one extra bit to store an error code, wherein the error code indicates the type of defect in the defective element; and
   a redundant circuit to compare address requests to the addresses in the registers, wherein the redundant circuit directs address requests matching addresses in the registers to the associated redundant element instead of the defective element in the memory array.

2. The flash memory system of claim 1, wherein the flash memory system further comprises:
   control circuitry to execute an erase operation algorithm based on the error code stored in a register.

3. The flash memory system of claim 1, wherein the defective element is a defective row and the redundant element is a redundant row.

4. The flash memory system of claim 1, wherein the defective element is a defective column and the redundant element is a redundant column.

5. The flash memory system of claim 1, wherein the error code stored in the register indicates an error type that is one of a row-to-row short, a row-to-column short, and an isolated defect.

6. The flash memory system of claim 1, wherein the register is one of fuses, anti-fuses, and non-volatile cells.

7. The flash memory system of claim 1, wherein the system is adapted to simultaneously program rows that are shorted together during a pre-program operation.

8. The flash memory system of claim 1, wherein the system is adapted to simultaneously program rows that are shorted together during a soft-program operation.

9. The flash memory system of claim 1, wherein the system is adapted to simultaneously program a row and a column that are shorted together during a pre-program operation.

10. The flash memory system of claim 1, wherein the system is adapted to simultaneously program a row and a column that are shorted together during a soft-program operation.

11. A flash memory system comprising:
    a processor to provide data;
    a memory array to store data from the processor, the memory array having memory cells arranged in columns and rows;
    at least one redundant row to replace an associated defective row in the memory array;
    at least one redundant column to replace an associated defective column in the memory array;
    a register for each redundant row and each redundant column to store the address of each associated defective row and each associated defective column, each register having at least extra one bit to store an error code, wherein the error code indicates the type of defect in the respective defective row or column;
    a redundant circuit to compare address requests to the addresses in the registers, wherein the redundant circuit directs address requests matching addresses in the registers to the associated redundant row or column instead of the defective row or column in the memory array; and
    a state machine to execute an erase operation algorithm based on the error code stored in each register.

12. The flash memory system of claim 11, wherein the redundant circuit comprises:
    a first redundant circuit to compare address requests to defective columns in the memory array; and
    a second redundant circuit to compare address requests to defective rows in the memory array.

13. The flash memory system of claim 11, wherein the erase operation algorithm disables the redundant circuit during pre-programming and soft programming cycles of an erase operation when the error code indicates a row-to-column short.

14. The flash memory system of claim 11, wherein the erase operation algorithm disables the redundant circuit during pre-programming and soft programming cycles of an erase operation when the error code indicates a row-to-row short.

15. The flash memory system of claim 14, wherein the state machine simultaneously programs the rows shorted together during the pre-programming cycle.

16. The flash memory system of claim 14, wherein the state machine simultaneously applies a soft program pulse to the rows shorted together during the soft programming cycle if an over-erased cell is detected in a column coupled to the rows.

17. The flash memory system of claim 11, wherein the error code stored in the register indicates an error type that is one of a row-to-row short, a row-to-column short, and an isolated defect.

18. A system comprising:
    a processor coupled to a non-volatile memory device, wherein the non-volatile memory device comprises:
        a memory array, wherein the memory array contains a plurality of floating gate memory cells coupled in rows and columns;
        at least one redundant element to replace an associated defective element in the memory array;
        a register for each redundant element to store the address of an associated defective element, each register having at least one extra bit to store an error code, wherein the error code is adapted to indicate the type of defect in the defective element; and a redundant circuit, wherein the redundant circuit is adapted to compare address requests to the addresses in the registers and direct address requests matching addresses in the registers to the associated redundant element instead of the defective element in the memory array.

19. The system of claim 18, wherein the system further comprises:

control circuit to execute an erase operation algorithm based on the error code stored in a register.

20. The system of claim 18, wherein the defective element is a defective row or column and the redundant element is a redundant row or column.

* * * * *